United States Patent [19]

Radice

[11] Patent Number: 4,734,044

[45] Date of Patent: Mar. 29, 1988

[54] CONNECTORS FOR USE WITH PIEZOELECTRIC POLYMERIC FILM TRANSDUCERS

[76] Inventor: Peter F. Radice, 438 Springhouse Rd., King of Prussia, Pa. 19406

[21] Appl. No.: 853,584

[22] Filed: Apr. 18, 1986

[51] Int. Cl.[4] ............................................. H01L 41/04
[52] U.S. Cl. ..................................... 439/78; 310/365; 310/800
[58] Field of Search ........ 310/344, 348, 353, 363–368, 310/800, 71; 361/401, 414; 339/17 R, 17 C, 17 E, 17 F

[56] References Cited

U.S. PATENT DOCUMENTS

| | | | |
|---|---|---|---|
| 1,714,012 | 5/1929 | Fiego | 310/350 |
| 2,157,701 | 5/1939 | Hight | 310/318 |
| 2,260,842 | 10/1941 | Schwarzhaupt | 310/363 |
| 2,278,966 | 4/1942 | Williams | 310/331 |
| 2,481,951 | 9/1949 | Sabee et al. | 339/17 E |
| 3,888,639 | 6/1975 | Hastings et al. | 361/414 |
| 4,449,134 | 5/1984 | Skinner, Jr. | 346/75 |
| 4,517,918 | 5/1985 | Kaplan | 118/723 |
| 4,547,648 | 10/1985 | Longeway | 219/121 |

FOREIGN PATENT DOCUMENTS 52-50190  4/1977  Japan ................................. 310/353

Primary Examiner—Neil Abrams

[57] ABSTRACT

Piezoelectric polymer film transducers include a metallized film electrode deposited on each of the two surfaces of the film. The electrodes are provided with leads extending therefrom in staggered parallel relationship. Each lead of the improved connector is associated with a reinforced assembly comprising plastic strips, a terminal connector, optional spacer washers, and a metal rivet penetrating the assembly such that electrical contact is effected between the lead and terminal connector. To insure positive electrical contact, a conductive ink may be deposited on one of the plastic strips through which an orifice is provided. The orifice communicates with a selected lead. The ink coats walls of the orifice to insure electrical continuity between the lead and terminal connector. A modified connector assembly disposes the reinforced connectors beyond the edges of a substrate which carries or supports the piezoelectric polymer film transducers.

10 Claims, 7 Drawing Figures

CONNECTORS FOR USE WITH PIEZOELECTRIC POLYMERIC FILM TRANSDUCERS

STATEMENT OF THE INVENTION

This invention relates to piezoelectric transducers and more particularly to improved connectors for use with thin polymeric films employed as the piezoelectric element in the transducers.

BACKGROUND AND SUMMARY OF THE INVENTION

In the rapidly growing field of piezoelectric film applications, it is essential that reliable and inexpensive connectors for the thin piezoelectric and/or pyroelectric polymeric film be available since the films are comparatively delicate and frequently damaged by routine or normal handling.

The present invention provides improved connectors for use with piezoelectric polymer film transducers which are easy to assemble for large scale manufacture, more reliable than crimped teeth connectors used currently by several manufacturers, stronger than connectors employing compression methods of attachment using conductive elastomers, and offer permanent lead attachments. The present connectors are expected to find wide application on vibration sensors, speakers, non-intrusive monitors for medical devices for measuring infant heart rate and breathing. Such monitoring may readily be accomplished through sensors incorporated into the crib or bassinet mattress, in a sensor belt worn by the infant, and the like.

Briefly, the improved connectors of the present invention include a reinforcement assembly at the film electrode lead or lead attachment area, each assembly comprising reinforcing plastic strips, a ring tongue terminal connector, or merely a washer soldered or otherwise affixed to a lead wire, optional spacer washers, and a metal rivet disposed through the assembly and lead attachment associated therewith. To insure good electrical contact, the plastic strip which overlays the film electrode lead attachment may have conductive ink deposited thereon which penetrates an orifice provided through the plastic strip to at least coat portions of the walls of the orifice to thereby form a continuous electrical contact between the lead and terminal connector.

GENERAL DESCRIPTION OF THE PIEZOELECTRIC POLYMER FILM

Generally, polymeric materials are non-piezoelectric. Polyvinylidene fluoride (PVDF) is approximately 50% crystalline and 50% amorphous. The principal crystalline forms of PVDF are the highly polar $\beta$ form and the non-polar $\alpha$ form. High piezo response is associated with the polar $\beta$ form. By carefully controlling process steps to polarize the film, including mechanical orientation and treatment in an intense electric field, a highly piezoelectric and pyroelectric film results. Such a film is commercially available under the trademark KYNAR®, a product of Pennwalt Corporation, Philadelphia, PA., assignee of the present invention.

The procedure for poling is well known in the art and, in the case of dielectric polymer films, generally involves the application of a direct current voltage, e.g., 300 to 2000 kilovolts per centimeter of thickness of polymer film while first heating it to a temperature ranging between just above room temperature to just below the melting point of the film for a period of time and then, while maintaining the potential, cooling the film. Preferred systems for the continuous poling of piezoelectric (or pyroelectric) sensitive polymer film using a corona discharge to induce the piezoelectric charge are described in U.S. Pat. Nos. 4,392,178 and 4,365,283.

The invention is not limited to films made with PVDF only, and copolymers of vinylidene fluoride, and copolymerizable comonomers such as tetrafluoroethylene and trifluoroethylene, for example, may be employed.

DETAILED DESCRIPTION OF THE INVENTION

Figure 1:
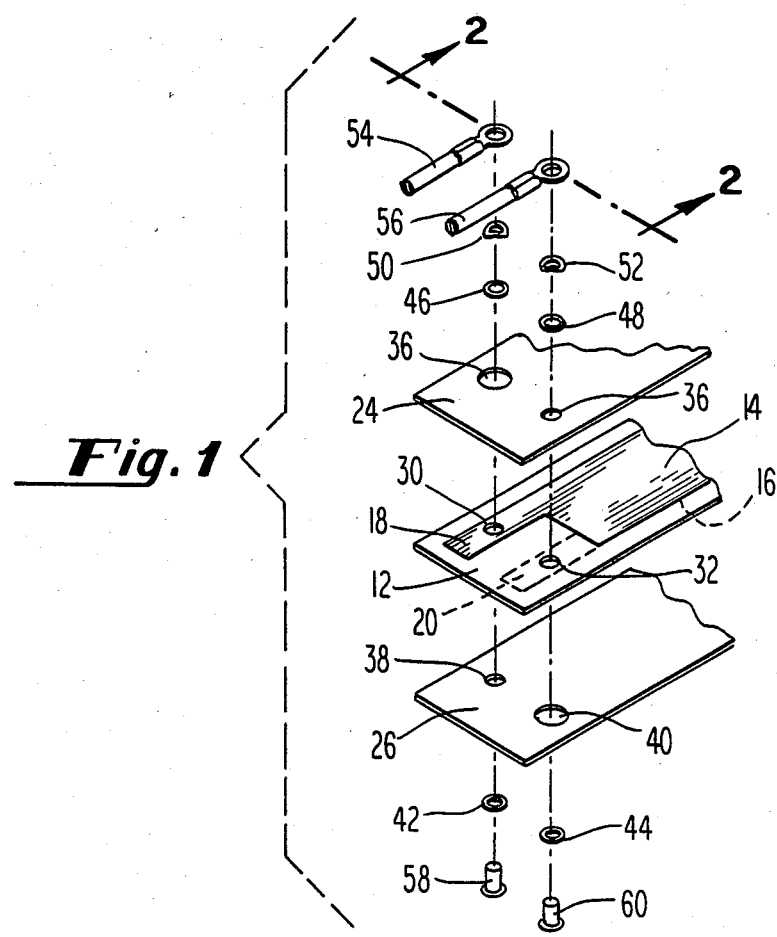
FIG. 1 is an exploded perspective view of components making up a typical reinforced connector assembly of the present invention for use with piezoelectric polymeric film transducers.
Figure 2:
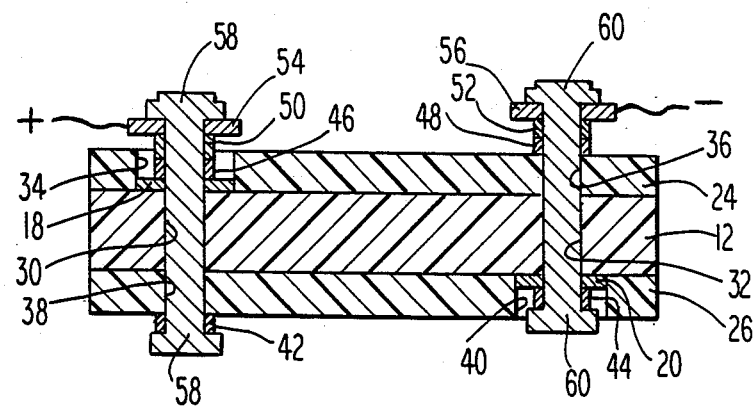
FIG. 2 is a sectional view of FIG. 1 taken along line 2—2 thereof.

In FIGS. 1 and 2, the piezoelectric transducer comprises a piezoelectric polymer film 12, typically KYNAR®, provided with a metallized electrode coating 14 adhered to an upper surface thereof and a similar electrode coating 16 adhered to its lower surface. Either electrode may comprise the hot or ground electrode.

Electrodes 14 and 16 are deposited on film 12 in substantial superposed relationship, unlike leads 18 and 20 respectively extending therefrom which are staggered. Care must be observed when depositing the electrodes on the surfaces of film 12 to insure that metal migration does not occur over the edges of the film to result in possible shorting out of the electrodes. Thus, film 12 provides a slight border around the electrodes to reduce this possibility.

Plastic strip 24, typically Mylar, is affixed over lead 18, and preferably over electrode 14, by any suitable non-conducting adhesive. Mylar is a polyethylene terephthalate resin film product of duPont. It is understood that other tough plastic materials may also be employed. A similar plastic strip 26 is adhered directly to the lower surface of film 12 over lead 20 and preferably over electrode 16.

Piezoelectric film 12, and plastic strips 24 and 26 are each provided with a pair of holes therethrough, typically punched-out holes. More specifically, holes 30 and 32 are disposed through electrode leads 18 and 20 respectively as shown. Plastic strips 24 and 26 are each provided with holes 34,36 and 38,40 respectively. Holes 34, 30 and 38 are in alignment as are holes 36, 32, and 40. Holes 34 and 40 are made of larger diameter than the remaining holes of equal size for reasons to be later discussed. Plastic strips 24 and 26 are adhered to piezoelectric film 12 by a suitable adhesive.

Pairs of washers 42,44; 46,48; and 50,52, with a pair of ring tongue terminal connectors 54 and 56, and rivets 58 and 60, complete the assembly.

In FIG. 2, terminal connector 54, indicated of positive polarity, for convenience, makes electrical contact with electrode coating 18 through metallic washers 50 and 46 and rivet 58.

Connector terminal 56, designated of negative polarity, electrically contacts electrode coating 20 by means of washer 44 and rivet 60. It is appreciated, of course, that more or fewer spacer washers may be employed with each rivet.

Figure 3:
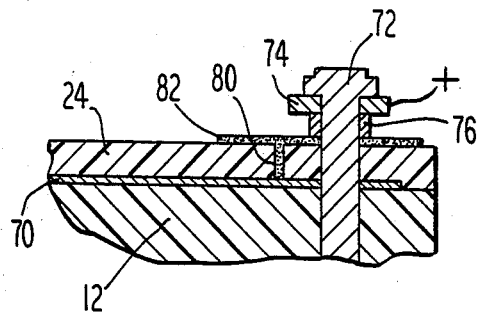
FIG. 3 is a longitudinal sectional view of a portion of a modified connector assembly.

In FIG. 3, piezoelectric polymer film 12 is provided with the usual metallic electrode coatings on each surface thereof, only lead attachment 70 being illustrated. Rivet 72, ring tongue terminal connector 74, and washer 76 are similar or equivalent to those components described with reference to FIGS. 1 and 2. Plastic strip 24 however is provided with an orifice 80 therethrough, typically a pin-hole or punched-out hole. The upper surface of plastic strip 24 is coated with a conductive ink 82 which contacts rivet 72 and penetrates orifice 80 to permit the ink to coat at least a portion of the walls of the orifice 80 or to fill or partially fill the void created by the orifice to thereby effect positive electrical contact between conductive ink 82 lead 70. The conductive ink may be applied by silk-screening, spraying, painting, and the like.

Figure 4:
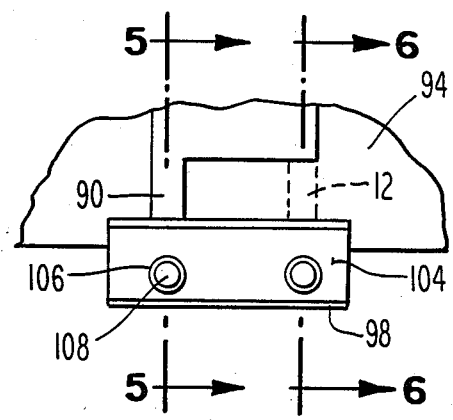
FIG. 4 is a fragmentary plan view, part in phantom, of another modification of a reinforced connector assembly of the present invention.
Figure 5:
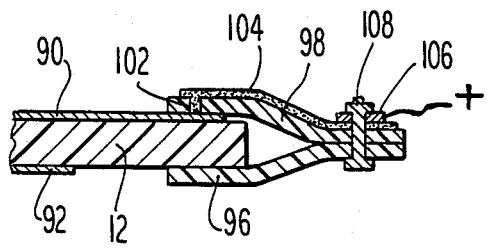
FIGS. 5 and 6 are sectional views of FIG. 4 taken along lines 5—5 and 6—6 thereof respectively.
Figure 6:
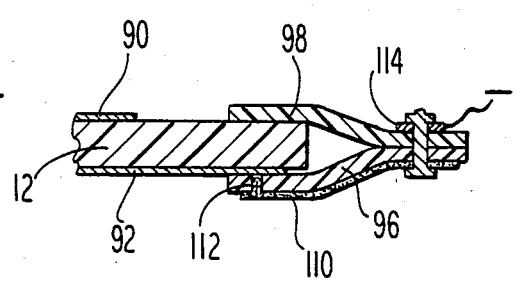

In FIG. 4, the piezoelectric transducer has electrode coating leads 90 and 92 extending toward the edge of any suitable substrate 94 to which the piezoelectric film is suitably adhered. The electrode and its lead 92 is disposed on the undersurface of film 12, the lead being shown in phantom. For purposes of economy, the connector assembly may comprise a pair of similar sheets of plastic 96 and 98 suitably adhered to the substrate and leads (FIGS. 5 and 6), or a single folded plastic sheet 100 may be adhered over leads 90 and 92 (FIG. 7).

Orifice 102 is provided through strip 98. A conductive ink 104 is applied to strip 98 which effects positive electrical contact between terminal connector 106 and electrode lead 90. Rivet 108 completes the connector assembly.

Conductive ink 110 is applied over plastic strip 96 (FIG. 6) which penetrates orifice 112 to insure positive electrical contact between terminal connector 114 and electrode lead 92.

Figure 7:
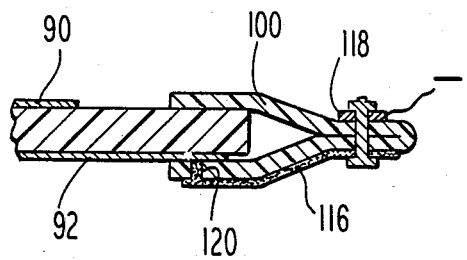
FIG. 7 is a sectional view, similar to FIGS. 5 and 6, of yet another modification of a reinforced connector assembly of the present invention.

In FIG. 7, plastic strip 100 is folded, and adhered to leads 90 and 92 as shown. Conductive ink 116 effects positive electrical contact between lead 92 and terminal connector 118 by means of orifice 120.

All rivets for connector assemblies of the present invention are applied conventionally, i.e., by hand, rivet gun, and the like.

The thickness of the piezoelectric polymer film used in the present invention may range between about 6μ to 110μ, and preferably 20 to 50μ whereas the mtallized film electrode coatings will typically be about 5–10μ in thickness. The coatings may be conveniently deposited on the piezoelectric polymeric film by a conventional silk screening process, for example, the silk-screening conductive ink comprising a finely divided electrically conductive metal, suitably silver, nickel or copper embedded within a polymer matrix.

I claim:

1. An improved connector for use with piezoelectric polymer film transducers adhered to a substrate comprising
    a film of piezoelectric polymer,
    a metallized film coating electrode provided on each face of said film in substantially superposed relationship, each of said electrodes having a lead extending substantially to an edge of said substrate in staggered parallel relationship, said upper lead and said lower lead each having a plastic strip adhered thereon, said plastic strips extending beyond edge of said substrate,
    aligned passageway means disposed through said plastic strips which extend beyond said substrate,
    rivet means disposed through each of said aligned passageway means,
    electrical terminal means contacting each of said rivet means to form a pair of secured adjacent connector assemblies beyond edge of said substrate,
    one of said plastic strips having an orifice disposed therethrough communicating with one of said leads,
    a conductive ink deposited over said one of said plastic strips and said orifice and contacting said rivet means associated therewith,
    said ink at least coating walls of said orifice forming good electrical contact between said one of said leads and said electrical terminal means associated therewith.

2. Connector of claim 1 wherein said plastic strip adhered onto said upper lead and said plastic strip adhered onto said lower lead is a folded integral plastic strip, said orifice is disposed through one of said folded strips, and said conductive ink is deposited over said one of said folded strips and said orifice.

3. A piezoelectric transducer assembly, comprising:
    (a) a film of piezoelectric polymer,
    (b) electrode means on opposite faces of the film, each electrode having a lead portion defining respective upper and lower leads,
    (c) non-conductive reinforcing means on opposite faces of the film adjacent said leads and at least partially overlapping said leads,
    (d) aligned openings disposed through each of said leads, said film and said reinforcing means,
    (e) conductive means disposed through each of the aligned openings and in electrical contact with the lead associated with the opening in which the conductive means is disposed,
    (f) terminal means attached to each of the conductive means for connecting the lead associated with the conductive means to an electrical circuit, and
    (g) secondary conductor means for providing electrical contact between one of said conductive means and its associated lead.

4. A piezoelectric transducer assembly as in claim 3, wherein the reinforcing means comprises upper and lower plastic strips.

5. A piezoelectric transducer assembly as in claim 3, wherein the reinforcing means comprises an integral plastic strip folded on itself to sandwich the upper and lower leads in said fold.

6. A piezoelectric transducer assembly as in claim 3, wherein the conductive means comprises rivet means.

7. A piezoelectric transducer assembly as in claim 6, wherein at least one conductive spacer means is disposed around each of said rivet means.

8. A piezoelectric transducer assembly as in claim 7, wherein at least one of said spacer means contacts said leads.

9. A piezoelectric transducer assembly as in claim 8, wherein a second conductive spacer means contacts the rivet means adjacent its end distal from the lead contacted by the first spacer means.

10. A piezoelectric transducer assembly as in claim 3, further comprising a second opening through one of the reinforcing means and communicating with one of the leads, and wherein the secondary conductor means comprises a conductive ink deposited over said one of the reinforcing means and its opening, the ink coating walls of the opening to form said electrical contact.

* * * * *